United States Patent [19]

Bottomley

[11] Patent Number: 4,636,730
[45] Date of Patent: Jan. 13, 1987

[54] NMR SPECTROSCOPY BODY PROBES WITH AT LEAST ONE SURFACE COIL

[75] Inventor: Paul A. Bottomley, Clifton Park, N.Y.

[73] Assignee: General Electric Company, Schenectady, N.Y.

[21] Appl. No.: 641,540

[22] Filed: Aug. 16, 1984

[51] Int. Cl.$^4$ ............................................. G01R 33/20
[52] U.S. Cl. ...................................... 324/318; 324/322
[58] Field of Search ............... 324/300, 307, 309, 318, 324/319, 320, 322, 313

[56] References Cited

U.S. PATENT DOCUMENTS

| 3,771,055 | 11/1973 | Anderson | 324/322 |
| 4,435,680 | 3/1984 | Froncisz | 324/318 |
| 4,439,733 | 3/1984 | Hinshaw | 324/313 |
| 4,563,648 | 1/1986 | Hill | 324/318 |

Primary Examiner—Michael J. Tokar
Attorney, Agent, or Firm—Geoffrey H. Krauss; James C. Davis, Jr.; Marvin Snyder

[57] ABSTRACT

An NMR spectroscopy body probe is comprised of at least one surface coil, each coil having at least one turn and positioned adjacent to a first surface of an insulative member; an electric-field-reducing shield is fabricated upon the other surface of the relatively flexible substrate. The shield surface of the probe is to be positioned closest to the sample. A plurality of surface coil-bearing substrates can be stacked, one adjacent to the other with the planes thereof substantially parallel to each other and to the plane of the electric-field shield, and with each individual surface coil being separately tunable to a different nuclei species resonance frequency. Each surface coil can be utilized for both transmission and reception, or can be used for only reception of the re-radiated signal from the sample, with a separate excitation coil being provided with a radius substantially greater than the average radius of the (receiver) surface coil and positioned in the plane of any of the at least one receiving surface coils.

25 Claims, 9 Drawing Figures

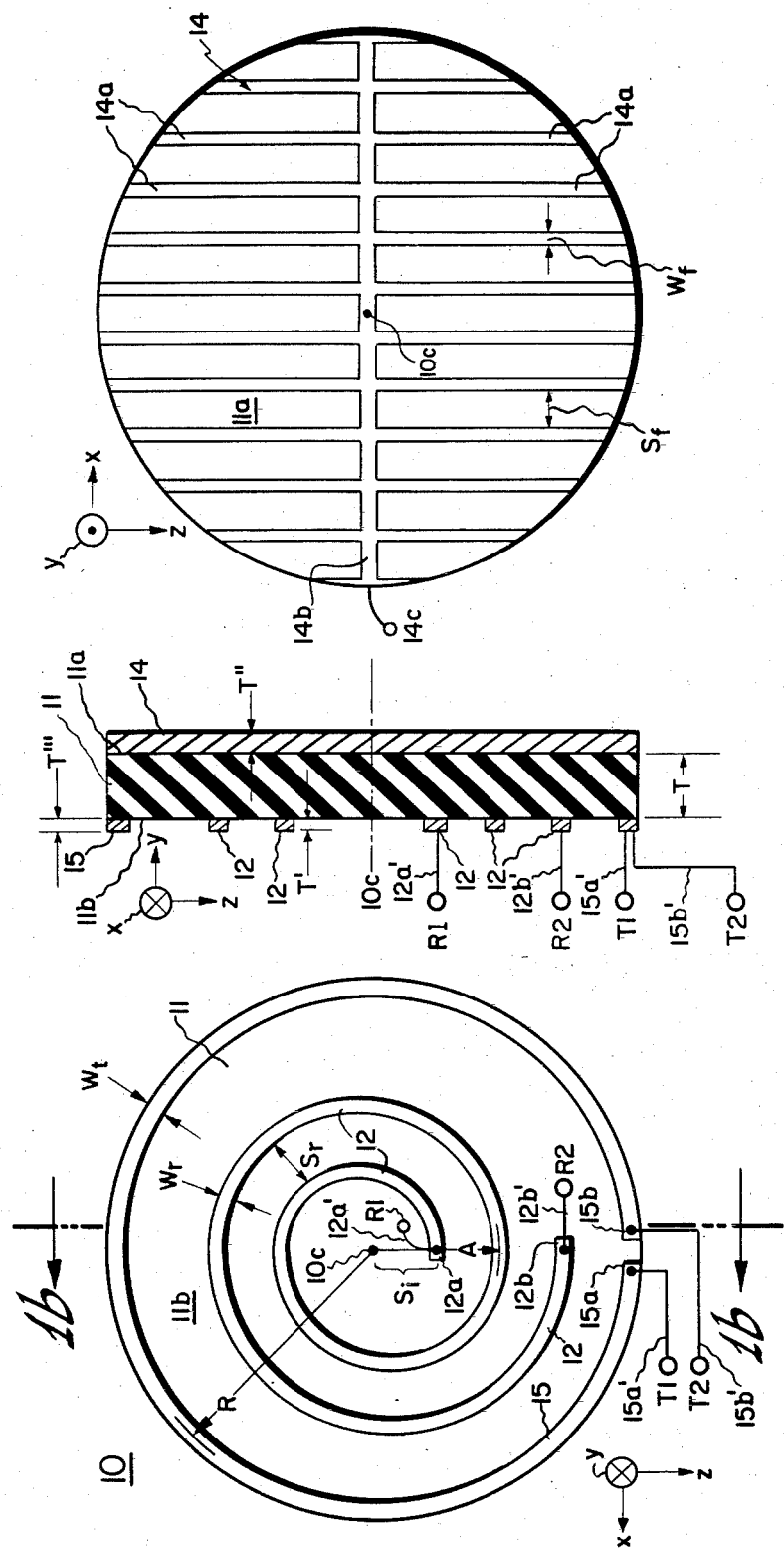

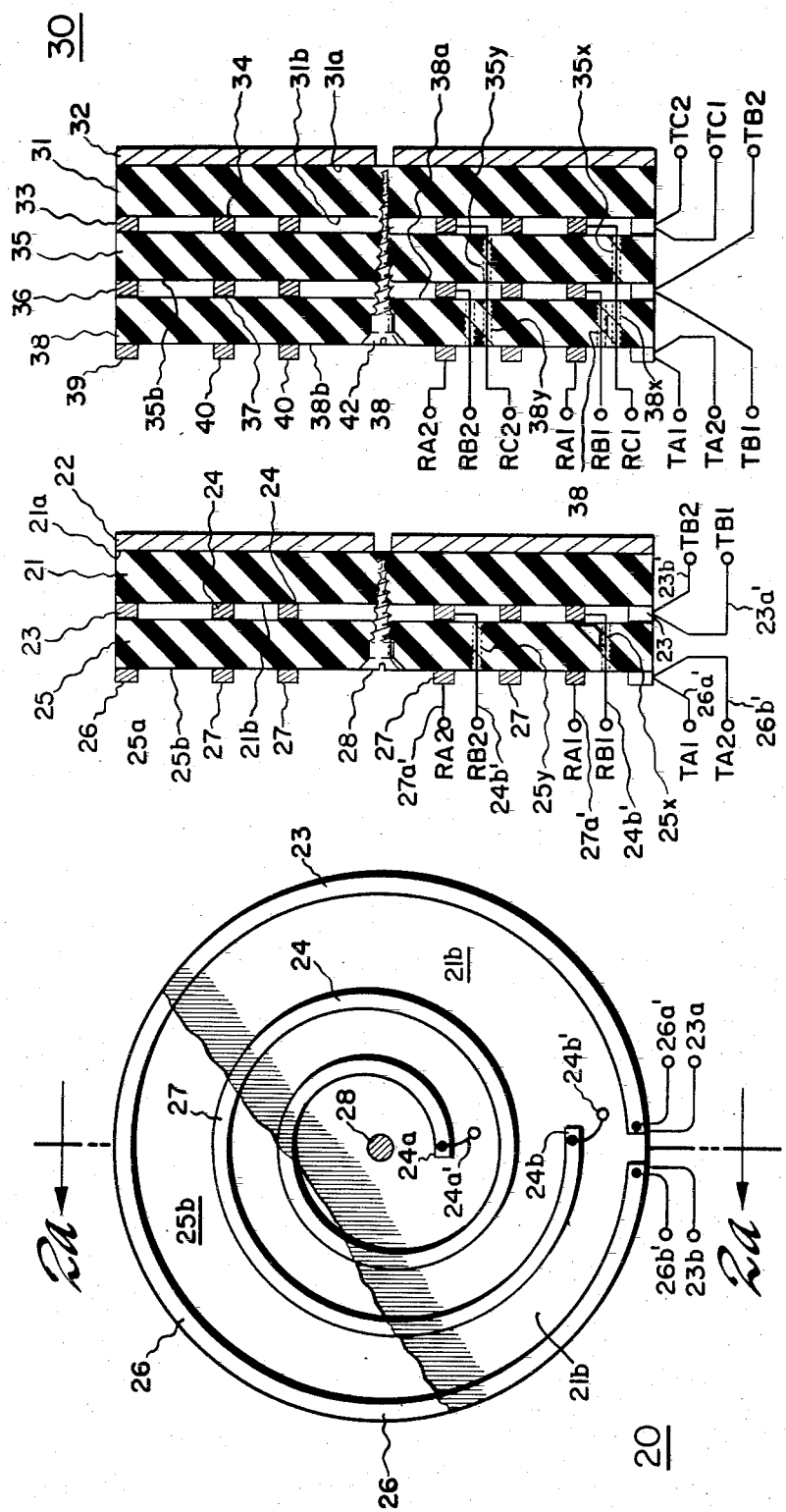

NMR SPECTROSCOPY BODY PROBES WITH AT LEAST ONE SURFACE COIL

BACKGROUND OF THE INVENTION

The present application relates to nuclear magnetic resonance (NMR) spectroscopy and, more particularly, to novel NMR spectroscopy body probes having at least one surface coil.

It is known to utilize surface coil NMR spectroscopy for studying living tissue by imaging spectra from atoms, such as $^1$H, $^{13}$C, $^{19}$F, $^{31}$P, and the like, having an odd number of nucleons. Studies of cerebral ischaemia, stroke and myocardial infarct drug therapy efficacy have all been carried out utilizing NMR spectroscopy. In the typical NMR spectroscopy experiment, the living tissue is immersed in a substantially homogeneous static magnetic field $B_0$, typically directed along one axis, e.g. the Z axis, of a threedimensional Cartesian set of coordinates. Under the influence of the magnetic field $B_0$, the nuclei (and therefore the net magnetization M) precess or rotate about the axis of the field. The rate, or frequency, at which the nuclei precess is dependent upon the strength of the applied magnetic field and on the nuclei characteristics. The angular frequency of precession $\omega$, is defined as the Larmor frequency and is given by the equation: $\omega = \gamma B_0$, in which $\gamma$ is the gyromagnetic ratio (constant for each type of nucleus). The frequency at which the nuclei precess is therefore substantially dependent on the strength of the magnetic field $B_0$, and increases with increasing field strength. Because the precessing nucleus is capable of absorbing and re-radiating electromagnetic energy, a radio-frequency (RF) magnetic field at the Larmor frequency can be utilized to excite the nuclei and receive imaging response signals therefrom. It is possible, by superimposing one or more magnetic field gradients of sufficient strength, to spread out the NMR signal spectrum of the sample and thereby distinguish NMR signals arising from different spatial postions in the sample, based on their respective resonant frequencies. Spatial positions of the NMR signals are determinable by Fourier analysis and knowledge of the configuration of the applied magnetic field gradient, while chemical-shift information can be obtained to provide spectroscopic images of the distribution of a particular specie of nucleus within the imaged sample.

Because the various nuclei to be investigated by NMR spectroscopy have widely differing values of the gyromagnetic constant $\gamma$, the resonant frequencies of these nuclei will vary over a similarly large range. Therefore, a surface coil properly tuned to one of the nuclei resonances will be improperly tuned at other nuclei resonant frequencies. Further, as a surface coil probe must be positioned in close proximity to the exterior of the sample portion to be image, the surface coil probe so positioned will allow the RF electric field of the probe to undesirably heat the imaged sample. The RF electric field is unnecessary, as only the RF magnetic field is needed for NMR imaging and spectroscopy.

Accordingly, it is desirable to provide NMR spectroscopy body probes with at least one surface coil, having a reduced electric field, capable of being conformally fitted to the exterior surface of the sample to be investigated, and capable of exciting a selected one, or a plurality, of several nuclei resonances without the necessity for surface probe changing, retuning or any other time-consuming adjustments.

BRIEF SUMMARY OF THE INVENTION

In accordance with the invention, an NMR spectroscopy body probe is comprised of at least one surface coil, each coil having at least one turn and positioned adjacent to a first surface of an insulative member; and electric-field-reducing shield is fabricated upon the other surface of the substrate. The substrate may be relatively flexible so that the probe can be shaped to conform to the surface of the sample to be investigated.

In presently preferred embodiments of my novel surface coil probes, a Faraday screen is utilized as the shield upon the surface of the probe closest to the sample, while the other probe substrate surface has at least one surface coil thereon. Each coil is individually tuned to a different nuclei species resonance frequency. A plurality of surface coil-bearing substrates can be stacked, one adjacent to the other, in registration and with the planes thereof substantially parallel to each other and to the plane of the electric-field shield, and with each individual surface coil being separately tunable and connectable to an NMR spectrometer. Each surface coil can be utilized for both transmission and reception, or can be used for only reception of the re-radiated signal from the sample, with a separate excitation coil being provided for connection to the apparatus supplying the stimulus for exciting the RF magnetic field; the excitation (transmitter) coil can have a radius substantially greater than the average radius of the (receiver) surface coil, to more evenly excite the nuclei of the sample in the volume of interest. The at least one exciting coil can be positioned in the plane of any of the at least one receiving surface coil and may also be utilized for transmitting nuclei-specie saturation, proton decoupling, or relaxation time measurement signals.

Accordingly, it is one object of the present invention to provide novel NMR spectroscopy body probes having at least one surface coil.

This and other objects of the present invention will become apparent after a reading of the following detailed description, when considered in conjunction with the drawings.

BRIEF DESCRIPTION OF THE DRAWINGS

FIGS. 1a–1c are respective rear view, sectional side view (taken along the sectional line 1b—1b of FIG. 1a) and front view of a presently preferred first embodiment, having a single multi-turn response signal reception surface coil and a single-turn excitation surface coil;

FIGS. 2 and 2a are respectively a partially-sectioned rear view and a sectioned side view (along the sectional line 2a—2a of FIG. 2) of a presently preferred probe having a pair of surface coil antennae planes; and FIG. 3 is a sectional side view of a presently preferred embodiment of a probe having three surface coil antennae planes.

DETAILED DESCRIPTION OF THE INVENTION

Figure 1D:
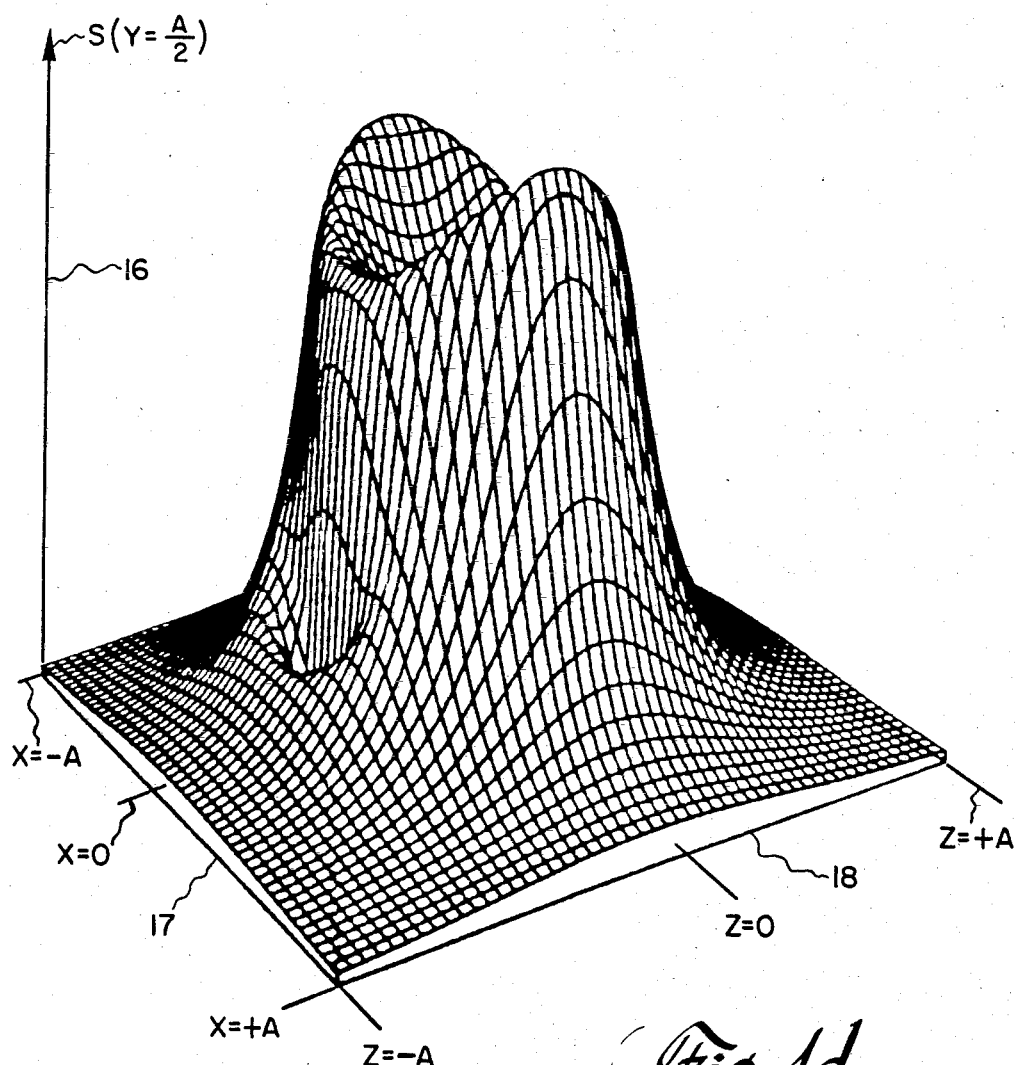
FIG. 1d is a graphical illustration of the sensitivity of a surface coil, utilized for both excitation and response signal reception, with respect to the plane thereof, and useful in understanding principles of the present invention.

Referring initially to FIGS. 1a–1c, a first presently preferred embodiment 10 of my novel NMR surface coil probe comprises a substrate 11 of an insulative material; substrate 11 has a first, forward surface 11a and a substantially-parallel second, rear surface 11b. First surface 11a is intended to be placed adjacent to the exterior surface of the sample to be investigated, with second surface 11b being further from the sample surface than substrate surface 11a. For convenience only, the three-dimension Cartesian coordinate X-Y-Z axis system is assigned as shown in the Figures, i.e. the plane of substrate 11 is lying in the X-Z plane, with the Y axis passing from the rear surface 11b to the front surface 11a of the substrate.

Rear substrate surface 11b has positioned adjacent thereto, either in abutment with the plane of the surface or fabricated into or immediately below the surface, a surface coil 12 having at least one turn. Surface coil 12 is fabricated of a conductive material, such as by (a) placing a conductive wire in a liquid insulative material (such as a Teflon ® or low-loss glass epoxy material and the like) prior to hardening of that substrate material, or (b) by etching, by printed circuit methods well known to that art, a conductive layer forming part of an at least one-sided printed circuit board. The conductive material of surface coil 12 forms the at least one turn spiral coil, commencing at a first end 12a closest to a probe center point 10c and spiraling out therefrom to a second end 12b furthest from center point 10c. The coil conductive strip has a width $W_r$ and, for a coil having more than one full turn, has a conductor-to-conductor separation distance $S_r$. Thus, the first end 12a of the surface coil is positioned at an initial distance $S_i$ from probe center point 10c and the second surface coil end 12b is, illustratively for a two-turn coil, at a distance of about $(S_i+2S_r+2W_r)$ from center point 10c. Because the spacing distance $S_r$ is at least equal to the width $W_r$ of the conductive strip for optimum operation, and the initial spacing distance $S_i$ between the center of the strip at the interior first end 12a and the probe center point 10c is much greater than either dimension $S_r$ or $W_r$, the average radius A of surface coil 12 is approximately: $A=(S_i+S_r N/2)$, where N is the number of surface coil 12 turns. First and second surface coil leads 12a′ and 12b′ are respectively connected between first and second surface coil ends 12a and 12b, respectively, and the respective surface coil terminals R1 and R2. It will be seen that, with the given relationships, an RF signal, provided between terminals R1 and R2, provides an RF magnetic field directed along probe center line 10c, with an RF electric field substantially parallel to the plane of surface coil 12, i.e. parallel to substrate surfaces 11a and 11b.

Faraday screen shield 14 is provided upon the forward first substrate surface 11a, to significantly attenuate the RF electric field and thus reduce, or prevent, any additional undesired electric field heating in the sample to be analyzed. Faraday shield 14 comprises a plurality of substantially parallel conductive strips 14a and a central conductive strip 14b connecting each of the strips 14a substantially at the midpoints thereof. By so positioning conductive strip 14b, the effective impedance of Faraday screen 14 is reduced by a factor of 2 over the impedance provided by connecting the ends of strips 14a. The reduction of the effective impedance allows the Faraday shield to appear more like a short circuit to the RF electric field, especially at increased Larmor frequencies encountered with static magnetic fields $B_0$ in the range, e.g. about 0.5 Tesla (T) to about 4 T, encountered with a superconducting-magnet NMR system. This is especially important in NMR spectroscopy, wherein the $B_0$ magnetic field magnitude is typically about 1.5 T, resulting in nuclei resonances typically in the 15–65 MHz. range. The lower-effective-impedance Faraday screen 14 is provided with a terminal 14c to allow connection thereto.

The inductance of surface coil 12 can be calculated, or actually measured, for a particular probe configuration, given the thickness T of the insulative dielectric substrate 11 and the effective thicknesses T′ and T″, respectively, of the respective surface coil 12 conductors and the Faraday shield conductor, on the opposite substrate surfaces.

In accordance with another aspect of the present invention, a second surface coil 15, e.g. of a single turn, can be fabricated with a conductor having an effective mid-line radius R, conductor width $W_t$, and conductor thickness T‴. Thickness T‴ can, if printed circuit etching technology is utilized, may be the same as the thickness T′ of the first surface coil 12. The radius R of the substantially circular second surface coil 15, from the first end 15a to second end 15b, will typically be at least twice the average radius A of the first surface coil. Second surface coil 15 has a pair of leads 15a′ and 15b′, respectively, connected between first and second coil ends 15a and 15b, respectively, and first and second terminals T1 and T2, respectively. Second surface coil 15 is particularly well suited for providing a more homogeneous RF excitation magnetic field in a sample, which sample produces a response signal received by first surface coil 12. Even if first surface coil 12 is utilized for both the excitation and reception of the Larmor frequency signals for a particular nuclei species, second surface coil 15 may be utilized for purposes such as NMR saturation/decoupling of other nuclei species whose presence does not otherwise substantially affect the obtaining of data from the selected nuclei species operated upon by the RF magnetic field provided by first surface coil 12.

It will be seen that the material of insulative substrate 11 and/or the thickness T of the substrate and the thicknesses T′, T″ and T‴ of the surface coil and Faraday screen layers, can be adjusted to provide probe 10 with a relatively high degree of flexibility, such that the probe can be suitably bent to fit the contours of the sample exterior surface adjacent to which will be placed the Faraday screen portion 14 of the probe, for NMR data acquisition purposes. I have found the use of Teflon ®-fiberglass printed circuit board to be particularly advantageous in forming contour-fitting probes; the extremely low loss tangent of this material at the Larmor frequencies involved is also advantageous in reducing the attenuation/noise-generation characteristics of the probe antennae.

Referring now to FIG. 1d, the spatial sensitivity of a surface coil, utilized for both excitation signal transmission and response signal reception, is shown to be roughly confined in area to the surface coil circumference and to about one surface coil radius in depth (along the surface coil center line). The plot of FIG. 1d has sensitivity, at a distance of about one-half the surface coil radius from the surface coil plane, i.e. at $y=A/2$, plotted along vertical axis 16. The surface coil is located in the x-z plane, with the surface coil center, e.g. probe center point 10c, being located at the position X=0 and Z=0. Thus, the orthogonal base plane extends in a first (X) direction, along axis 17, to a distance of one radius A from the X-axis center, i.e. from X= −A through the X=0 position to X= +A, and extends in the Z direction along axis 18 from Z= −A through the central Z=0 position to Z= −A. It will be seen that the region of substantial sensitivity forms a substantially circular area bounded by $X = \pm A/2$ and $Z = \pm A/2$, or a substantial-sensitivity area having a radius substantially equal to one-half the surface coil radius, at a distance equal to one-half the surface coil radius from the plane of the surface coil. The sensitivity is reduced to about one-half the illustrated values in a plane about one surface coil radius, e.g. at a distance A, from the surface coil plane, and at the surface coil plane itself. Thus, it will be seen that, in order to substantially uniformly excite nuclei within a volume bounded by a receiving antenna having the radius A of first surface coil 12, a separate excitation antenna, i.e. second surface coil 15, should have a radius R at least twice that of the receiving surface coil radius A.

Figure 1E:
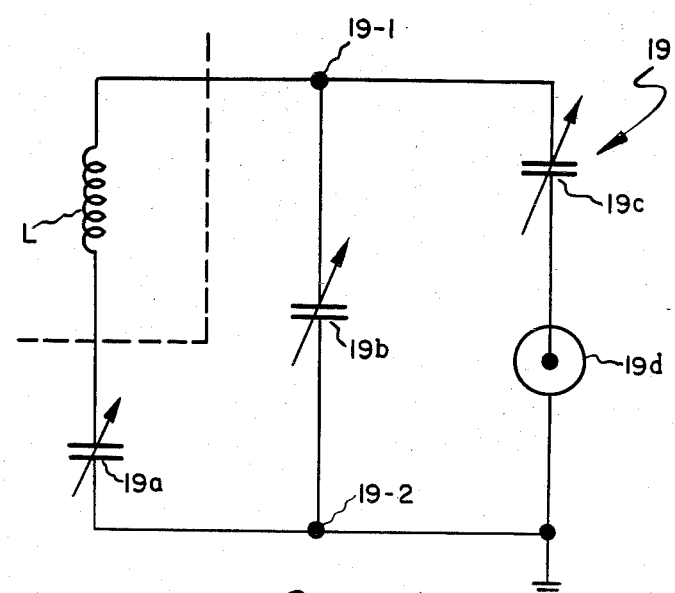
FIGS. 1e and 1f are schematic diagrams of two presently preferred tuning/impedance-matching circuits for use with each surface coil of the present invention.
Figure 1F:
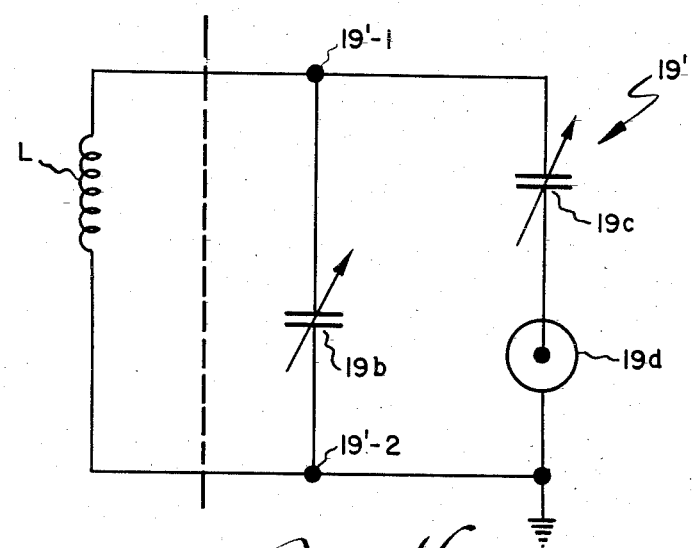

Referring now to FIGS. 1e and 1f, each surface coil utilized appears to be an inductance L, having an inductive reactance at the frequency of operation. The surface coil inductance must be matched to the impedance, typically 50 ohms, of the cable providing transmission excitation signals to the surface coil and/or being provided wtih received response signals from the surface coil. In presently preferred embodiments, and for the purposes of illustration only, impedance-matching networks 19 or 19' may be utilized. Network 19 provides a variable first capacitance 19a in series with the surface coil inductance L, with the series combination connected across a shunt variable capacitance 19b. Impedance-matching network 19' connects the surface coil inductance L directly across the shunt variable capacitance 19b. The terminals 19-1 or 19'-1 of either network are connected through another variable capacitance 19c to the non-grounded terminal of a probe output connector 19d, while the remaining network terminal 19-2 or 19'-2 is connected to the RF ground portion of the output connector 19d. The impedance-matching network 19 or 19' may be placed in a small, preferably shielded, box adjacent to the surface coil leads 12a'/12b' or 15a'/15b', of the surface coil with which the matching network is used. Because the coils of both surface coils are in the same plane, means for preventing interaction therebetween may be necessary; one example of such means is described and claimed in Application Ser. No. 641,234, filed on even date herewith, assigned to the assignee of the present application and incorporated herein in its entirety by reference.

Referring now to FIGS. 2 and 2a, a presently preferred embodiment 20 of a two-nuclei surface coil probe is illustrated. Probe 20 has a Faraday screen 22 on a first, forward surface 21a of a substrate and has a first transmission excitation coil 23, of a single turn, fabricated adjacent (i.e. on, at or into) the second, rear 21b surface of first substrate 21. Within the substantially circular area of first excitation surface coil 23 is formed a first reception surface coil 24, having at least one turn, e.g. a two-turn "spiral" surface coil 24 in the illustrated embodiment. While the conductor-to-conductor spacing of the reception coil 24 in this Figure, as in all other Figures, is somewhat exaggerated for the sake of illustration clarity, the at least one turn reception coil 24 has conductor widths and spacings such that the minimum and maximum surface coil radii are substantially equal to the average surface coil radius. A second insulative substrate 25 is positioned with a first, forward surface 25a thereof substantially adjacent to the rear surface 21b of the first substrate. Second substrate forward surface 21b can be in abutment with the conductors of first transmission surface coil 23 and first recption coil 24, if those conductors extend above the surface of first insulative substrate 21. The rear, second surface 25b of the second substrate has a second transmission excitation surface coil 26 and/or a second reception surface coil 27 fabricated adjacent thereto. The centers of surface coils 26 and/or 27 are in registration with the centers of surface coils 23 and/or 24, substantially at the probe center point 20c. Surface coils 26 and/or 27 can be fabricated by etching a conductive plane formed as part of a single-sided printed circuit board, or can be formed of conductors of any desired cross section and placed upon, in or below the surface of an insulative material which is subsequently hardened to substantially immovably hold the surface coils in the required position, even if the substrate is flexed. Second substrate 25 includes at least a pair of apertures 25x and 25y for allowing the first reception surface coil leads 24a' and 24b', respectively, to pass therethrough. The first transmission coil leads 23a' and 23b', the second transmission coil leads 26a' and 26b', and the second reception coil leads 27a' and 27b', can be directly extended from the body of probe 20 without passage through one or the other of the insulative substrates 21 or 25, if desired. A non-conductive fastening means 28 can be used to attach substrates 21 and 25 together, or the two substrates can be suitably adhered to one another.

It will be seen that this configuration allows the same probe 20 to obtain NMR response information for a pair of different nuclei, e.g. $^{13}C$ and $^{31}P$, with automatic registration of the sample volume in which each of the pair of nuclei are analyzed. If first and second response coils 24 and 27 are utilized as combination excitation transmission/response reception coils, first and second "excitation" coils 23 and 26 can be utilized for transmission of NMR suppression or NMR decoupling signals and the like. For other nuclei species, excitation will occur over at least the same volume as that volume to be imaged by the registered surface coils 24 and 27. The spectroscopy process can analyze first one and then the other of the nuclei, if a single channel spectrometer is used, or, is a multi-channel spectrometer is utilized, can, because of the relatively wide frequency spacing of the involved Larmor frequencies, simultaneously analyze the sample at the resonance frequency of the plurality of species associated with the plurality of different excitation/reception antennae. The latter use is particularly advantageous in that the required analysis time is reduced, while registration with respect to the sample and the analysis information therefrom, is maintained.

Referring now to FIG. 3, a presently preferred embodiment of a three-specie nested surface coil probe 30 is illustrated. A first substrate 31 has a Faraday screen 32 upon a first, forward surface 31a thereof, and has a first excitation coil 33 and a first reception coil 34 adjacent to the second, rear first substrate surface 31b. The first, forward surface 35a of a second insulative substrate 35 is adjacent to surface coils 33 and 34, while the second surface 35b of the second substrate 35 has a second excitation surface coil 36 and a second response coil 37 adjacent thereto. The first, forward surface 38a of a third substrate 38 is adjacent to the second excitation/reception surface coils 36 and 37, while the second, rear surface 38a of the third substrate carries a third excitation coil 39 and a third response coil 40 adjacent thereto. If the probe 30 is formed of three printed circuit boards (a first, double-sided board having insulative layer 31 with Faraday shield 32 and surface coils 33 and 34 thereon, and a pair of single-sided printed circuit boards respectively having insulative layers 35 or 38 and respective excitation and/or reception surface coils 35 and/or 36 and 39 and/or 40 thereon), the various layers can be permanently cemented to one another, or can be held together by means of insulated fastener 42, similar to insulated fastener 28 of the two-layer embodiment of FIGS. 2 and 2a. It will be seen that each layer must contain apertures therethrough in a sufficient number to allow a pair of leads for each more-forward substrate to pass therethrough from the receiving coils thereon. Thus, first substrate 31, having no substrate in front of it, is devoid of apertures, while second substrate 35 contains one pair of apertures 35x and 35y, and third substrate 38 contains two pair of apertures 38w/38z and 38x/38y, for allowing the two pair of leads from the two layers above substrate 38 to pass therethrough.

In general, an NMR spectroscopy surface coil probe has a member M, where M is at least one, of insulative substrates, with the first of the M substrates having a Faraday shield upon the forward surface thereof and with all of the M layers having at least one surface coil upon the rear surface thereof. Each of the M layers has a number of apertures L therethrough, where $L=2(m-1)$, for $1 \leq m \leq M$, and with the centers of surface coils formed upon the rear surface of each of the M layers being in registration with one another.

While several presently preferred embodiments of my novel NMR spectroscopy body probes with at least one surface coil have been illustrated and described in detail herein, many modification and variations will now become apparent to those skilled in the art. It is my intent, therefore, to be limited only by the scope of the appending claims and not by the specific details and instrumentalities presented by way of explanation and illustration herein.

What I claim is:

1. An antenna probe for use with an NMR system, comprising:
    an insulative substrate having at least initially planar opposed first and second surfaces arranged to be positioned respectively nearest to and furthest from an adjacent exterior surface of an object to be investigated;
    at least one surface coil antenna, each having at least one turn of a single conductive member connected only between first and second coil ends, fabricated initially as, and reconfigurable to, a planar coil of one of substantially circular and substantially spiral shape in the plane of, and adjacent to, said second substrate surface; each surface coil antenna providing a spatially non-uniform magnetic field when a single radio-frequency current flows therethrough;
    means fabricated adjacent to said first surface for substantially attentuating the radio-frequency electric field of any signal radiated by said at least one surface coil antenna; and
    at least one means for separately connecting to said first and second coil ends of each different one of said at least one surface coil antenna, to allow each surface coil antenna to provide a single radio-frequency signal, received from said object, to said system or to radiate a single radio-frequency signal, received from said system, to said object.

2. The antenna probe of claim 1, wherein said attenuating means is a Faraday shield.

3. The antenna probe of claim 2, wherein said Faraday shield comprises: a plurality of substantially parallel conductive elements, spaced apart from one another; and a single central conductive member connected substantially to the midpoint of each conductive element.

4. The antenna probe of claim 1, wherein at least one of said at least one surface coil antenna comprises an initially planar spiral having a plurarity of turns of said conductive member.

5. The antenna probe of claim 4, wherein the conductive member of each surface coil has a predetermined width, said plurality of surface coil turn having a preselected spacing therebetween not less than said predetermined width, and said surface coil has an average radius exceeding both the width of the conductive member and the turn-to-turn spacing thereof.

6. The antenna probe of claim 1, wherein a pair of surface coil antennae are fabricated adjacent to said insulative substrate second surface, a first one of said surface coil antenna having a first predetermined average radius; the remaining one of said surface coil antenna having a predetermined second average radius greater than the average radius of the first surface coil antenna; and said connecting means comprises first means for connecting the first and second ends of the first surface coil to said system; and second means for separately connecting the first and second ends of the larger-radius surface coil to said system.

7. The antenna probe of claim 6, wherein the larger-radius surface coil antenna has a single turn of a conductive member.

8. The antenna probe of claim 7, wherein the smaller-radius surface coil antenna has a plurality of turns of a conductive member.

9. The antenna probe of claim 6, wherein each of the first and second surface coil antennae are resonant at a different frequency.

10. The antenna probe of claim 6, wherein each of said first and second surface coil antennae resonates substantially at the Larmor frequency of a nuclei specie to be investigated in said object.

11. The antenna probe of claim 10, wherein said second means receives a first radio-frequency signal from said system for excitation of said object; and said first means provides a second radio-frequency signal, received from said object, to said system.

12. The antenna probe of claim 10, wherein the average radius of the larger-radius surface coil antenna is not less than twice the average radius of the smaller-radius surface coil antenna.

13. The antenna probe of claim 1, further comprising: at least one other insulative substrate having a first surface positioned adjacent to the second surface of the previous substrate; and a second surface opposite to said first surface; and at least one surface coil antenna adjacent to the second surface of each other layer.

14. The antenna probe of claim 13, wherein each other layer includes means passing therethrough for allowing passage therethrough of the connecting means from at least one surface coil antenna on at least one previous substrate second surface.

15. The antenna probe of claim 13, wherein said at least one other layer is a second insulative substrate having a first surface adjacent to the second surface of said insulative substrate and having said at least one other surface coil antenna fabricated adjacent to a surface thereof furthest from said attenuating means.

16. The antenna probe of claim 15, wherein each of said substrate and said second substrate have a reception surface coil antenna upon the second surfaces respectively thereof, each of said reception surface coil antennae being respectively substantially resonant at the Larmor frequency of respectively different nuclei species.

17. The antenna probe of claim 16, wherein at least one of said substrate and said second substrate have an excitation surface coil antenna fabricated adjacent to the second surface thereof.

18. The antenna probe of claim 17, wherein an excitation surface coil antenna is fabricated adjacent to the second surface of each of said substrate and said second substrate.

19. The antenna probe of claim 18, where at least one of the excitation antennae is substantially resonant at the same frequency as the substantial resonance of at least one associated reception surface coil antenna.

20. The antenna probe of claim 13, further comprising at least one additional insulative substrate having a first surface positioned adjacent to the second surface of said other substrate, and a second surface opposite to said first surface; and at least one surface coil antenna fabricated adjacent to the second surface of each additional layer.

21. The antenna probe of claim 20, wherein each of said substrate, said other substrate and said additional substrate have a reception surface coil antenna upon the second surfaces respectively thereof, each of said reception surface coil antennae being respectively substantially resonant at the Larmor frequency of respectively different nuclei species.

22. The antenna probe of claim 21, wherein at least one of said substrate, said other substrate and said additional substrate have an excitation surface coil antenna adjacent to the second surface thereof.

23. The antenna probe of claim 22, further comprising an excitation surface coil antenna adjacent to the second surfce of each substrate of said probe.

24. The antenna probe of claim 22, where at least one of the excitation antennae is substantially resonant at the same frequency as the substantial resonance of at least one associated reception surface coil antenna.

25. The antenna probe of claim 1, wherein said probe is adapted to substantially conformally fit the curve of said object exterior surface.

* * * * *